(12) United States Patent
Buydens et al.

(10) Patent No.: US 9,534,959 B2
(45) Date of Patent: Jan. 3, 2017

(54) INFRARED SENSOR PACKAGE

(71) Applicant: Melexis Techologies NV, Tessenderlo (BE)

(72) Inventors: Luc Buydens, Kasterlee (BE); Sam Maddalena, Zelem (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 6 days.

(21) Appl. No.: 14/699,112

(22) Filed: Apr. 29, 2015

(65) Prior Publication Data

US 2015/0308899 A1     Oct. 29, 2015

(30) Foreign Application Priority Data

Apr. 29, 2014 (GB) .................... 1407477.7

(51) Int. Cl.

| | | |
|---|---|---|
| *G01J 5/02* | (2006.01) | |
| *G01J 5/04* | (2006.01) | |
| *G01J 5/12* | (2006.01) | |
| *G01J 5/08* | (2006.01) | |
| *G01J 5/20* | (2006.01) | |
| *H01L 31/18* | (2006.01) | |

(52) U.S. Cl.
CPC .............. *G01J 5/0215* (2013.01); *G01J 5/024* (2013.01); *G01J 5/0225* (2013.01); *G01J 5/045* (2013.01); *G01J 5/048* (2013.01); *G01J 5/0806* (2013.01); *G01J 5/0862* (2013.01); *G01J 5/12* (2013.01); *G01J 5/20* (2013.01); *H01L 31/18* (2013.01)

(58) Field of Classification Search
CPC .................. G01J 5/12; G01J 5/08; B81B 7/00
See application file for complete search history.

(56) References Cited

U.S. PATENT DOCUMENTS 5,962,854 A  * 10/1999  Endo .............................. 250/349
7,180,064 B2    2/2007  Lee et al.
(Continued)

FOREIGN PATENT DOCUMENTS

| JP | H11-258041 A  | 9/1999 |
| JP | 2000-298063 A | 10/2000 |
| JP | 2004-037297 A | 2/2004 |

OTHER PUBLICATIONS

Great Britain Search Report for corresponding Great Britain Application No. 1407477.7, Aug. 13, 2014.
(Continued)

*Primary Examiner* — Marcus Taningco
(74) *Attorney, Agent, or Firm* — Workman Nydegger

(57) ABSTRACT

The present invention relates to an integrated infrared sensor device, comprising a sensor substrate and a filter substrate. The sensor substrate has a back surface and a front surface opposite the back surface, in which the back surface has a cavity defined therein and the front surface has at least one infrared sensing element formed therein or arranged thereon, covered with a cap for protecting the at least one sensing element, e.g. against mechanical damage and dust, and/or against stray radiation. The filter substrate is arranged on the back surface of the sensor substrate such that the filter substrate at least partially covers the cavity. The filter substrate is adapted in shape and composition to transmit infrared radiation and to attenuate radiation in at least part of the visible light spectrum.

7 Claims, 2 Drawing Sheets

(56) References Cited

U.S. PATENT DOCUMENTS

| | | |
|---|---|---|
| 9,113,096 B1* | 8/2015 | Azuma |
| 2002/0079504 A1* | 6/2002 | Kim ................................ 257/98 |
| 2005/0081905 A1 | 4/2005 | Lan et al. |
| 2006/0038129 A1 | 2/2006 | Watanabe |
| 2008/0202209 A1 | 8/2008 | Lambkin et al. |
| 2010/0213374 A1 | 8/2010 | Meinel et al. |
| 2011/0147869 A1 | 6/2011 | Lazarov et al. |
| 2012/0049066 A1 | 3/2012 | Lee |
| 2014/0367818 A1* | 12/2014 | Iguchi et al. ................. 257/432 |

OTHER PUBLICATIONS

Extended European Search Report from EP Application No. 15165772.3, Sep. 8, 2015.

\* cited by examiner

INFRARED SENSOR PACKAGE

FIELD OF THE INVENTION

The present invention relates to the field of integrated infrared sensor devices. More specifically it relates to an integrated circuit chip package comprising an infrared sensing element.

BACKGROUND OF THE INVENTION

Infrared sensors are used in a wide range of applications, for example, for contact-less measurement of the temperature of thermal sources, such as in remote monitoring of high-temperature industrial processes or in thermal insulation assessment of buildings, or for presence detection of humans. For example, typical application areas of infrared sensors may be found in security, e.g. intruder detection, or in automotive industry, e.g. for monitoring the driver and/or passengers of a vehicle. In many applications, the cost and complexity of the infrared sensor may be an important constraint. Thermopile sensors may be considered as cheap and robust detection means for infrared sensing, which, unlike for example direct photodetection in the infrared range, can operate in room temperature conditions, e.g. without requiring active cooling.

Integrated infrared sensor devices may typically comprise at least one infrared sensing element. For example, in known sensor devices, the infrared sensor device may comprise a volume of infrared absorbing material arranged on the semiconductor wafer such that it can be exposed to incident infrared radiation. A temperature difference between this absorber and the surrounding material, which forms or thermally connects to a heat sink, may be used to generate an appropriate signal indicative of the incident radiation, e.g. a voltage, current, resistance or other electrical quantity which is influenced by the temperature difference.

The temperature difference may for example be detected by one or more thermocouples having hot junctions in or near the absorber and cold junctions in or near the surrounding material. A thermistor element may further be provided to determine a reference temperature of the surrounding material.

Good thermal isolation between the absorber and the surrounding material, such that an optimal thermal flow is channeled through the at least one thermocouple, is known to be advantageous. Therefore, the absorbing material may be arranged such that contact with the wafer material is minimized, for example, by arranging the absorber on a thin support structure, e.g. on a membrane supported by the wafer or on a bridge structure formed by removing a portion of the wafer by etching. Furthermore, the absorber may be encapsulated in a cavity, e.g. a gas-filled cavity, such as a cavity filled with air, or a vacuum cavity. Manufacturing thin support structures, such as a membrane or bridge structure, may require advanced processing techniques which are known in the art for applications in micro-electromechanical systems (MEMS).

Integrated infrared sensor devices, as known in the art, may also comprise processing means for converting the signal produced by the infrared sensing element or elements into a convenient output signal. This processing means, e.g. an application-specific integrated circuit (ASIC), may apply amplification, signal filtering, analog-to-digital conversion, and/or reference temperature correction, or may apply other processing known for this purpose in the art.

In integrated infrared sensor devices known in the art, the processing means, e.g. ASIC, may be implemented on a separate semiconductor die, and the infrared sensing element and ASIC may be operably connected by wiring and mounted in an enclosure, e.g. a transistor outline (TO) package. The top surface of such TO package may be provided with an infrared window, e.g. a filter which blocks or significantly attenuates electromagnetic wavelengths outside the infrared range, while substantially transmitting the incident infrared radiation.

However, in many applications it is desirable to obtain an integrated infrared sensor device in a compact enclosure, e.g. in a chip-level package or wafer-level package. It may be particularly advantageous to provide an integrated infrared sensor device with a reduced height profile, for example, such that the device when mounted on a carrier, e.g. on a printed circuit board (PCB), extends less than 2 mm above the mounting surface of the carrier, for example extends 1 mm above this surface or even less than 1 mm. For example, a package may need to remain lower than 1 mm above the mounting surface when mounted in order to be compatible with typical integration techniques used in the art.

In United States patent application No. US 2011/0147869, an infrared sensor is disclosed which is integrated into a wafer-scale chip package. Such package has the advantage that a larger enclosure having an infrared window provided therein, e.g. a TO package in particular, is not required. A cavity is provided below the radiation sensitive element, e.g. by etching a thin layer of epitaxial silicon, in order to thermally insulate this radiation sensitive element from the substrate. The back side of the sensor chip can be used, in accordance with this prior disclosure, as a window for infrared radiation which functions as a visible light filter. An optical element, such as a Fresnel lens, can also be formed directly on the back surface of the chip, for example by conventional photolithography processing. This sensor device further comprises bonding pads to connect the sensor device to mounting conductors through bumps, such that the device can be mounted in a low height profile arrangement on a carrier.

U.S. Pat. No. 7,180,064 discloses another related sensor device. In this device, a cavity is etched in a silicon substrate. A membrane is arranged over this cavity which comprises the radiation sensitive elements. Additional layers of absorbing or reflecting material may be provided on the membrane. The backside surface of the substrate is further provided with an antireflective coating, and an entry window is formed in an outer coating on the backside surface.

SUMMARY OF THE INVENTION

It is an object of embodiments of the present invention to provide good integration of infrared sensor devices, e.g. to provide good and efficient encapsulation of an integrated circuit chip for infrared sensing.

The above objective is accomplished by a method and device according to embodiments of the present invention.

It is an advantage of embodiments of the present invention that compact integration of infrared sensor devices is provided. It is a further advantage of embodiments of the present invention that a filtering layer and/or lens structure may be easily provided in or on such compact infrared sensor device.

It is an advantage of embodiments of the present invention that encapsulation of infrared sensor elements is provided which only requires few non-standard semiconductor processing techniques, e.g. which does not require complex MEMS manufacturing steps. It is an advantage of embodiments of the present invention that encapsulation of infrared sensor elements is provided by a cheap and simple technique, e.g. which is compatible with and/or comprises standard backside etching techniques.

It is an advantage of embodiments of the present invention that an infrared sensor device package is provided having a low profile, e.g. having a limited height when mounted on a carrier, such as on a printed circuit board.

In a first aspect, the present invention relates to an integrated infrared sensor device, comprising a sensor substrate having a back surface and a front surface opposite the back surface, wherein the back surface has a cavity defined therein, and the front surface has at least one infrared sensing element formed therein or arranged thereon. The integrated infrared sensor device comprises a filter substrate arranged on the back surface of the sensor substrate such that the filter substrate at least partially covers the cavity. The filter substrate is adapted in shape and composition to transmit infrared radiation and to attenuate radiation in at least part of the visible light spectrum. The integrated infrared sensor device furthermore comprises a cap for protecting the at least one sensing element, e.g. against mechanical damage and dust, and/or against stray radiation; the cap being arranged on the front surface.

An integrated infrared sensor device according to embodiments of the present invention may furthermore comprise at least one solder bump arranged on the front surface of the sensor substrate for connecting the integrated infrared sensor device to a carrier in a flip-chip arrangement. This connecting may refer to thermally and/or electrically connecting the integrated infrared sensor device to the carrier, e.g. to physically and electrically connecting the integrated infrared sensor device to corresponding mounting conductors.

In an integrated infrared sensor device according to embodiments of the present invention, the filter substrate may be bonded to the back surface of the sensor substrate.

In an integrated infrared sensor device according to embodiments of the present invention, the filter substrate may be bonded to the back surface by glass frit bonding.

In an integrated infrared sensor device according to embodiments of the present invention, the at least one infrared sensing element may comprise a first and a second temperature-sensitive element in a dielectric stack, and the cavity may be adapted for thermally insulating the first temperature-sensitive element from the second temperature-sensitive element.

An integrated infrared sensor device according to embodiments of the present invention may furthermore comprise a coating applied to the filter substrate for collimating a field of view of the at least one infrared sensing element.

In a second aspect, the present invention also relates to a method for manufacturing an integrated infrared sensor device, e.g. an integrated infrared sensor device according to embodiments of the first aspect of the invention. This method comprises obtaining a sensor substrate having a back surface and a front surface opposite the back surface, providing at least one infrared sensing element on the front surface, etching a cavity in the back surface, providing a filter substrate on the back surface for at least partially covering the cavity, in which the filter substrate is adapted in shape and composition to transmit infrared radiation and to attenuate radiation in at least part of the visible light spectrum, and providing a cap at the front surface for protecting the at least one sensing element, e.g. against mechanical damage and dust, and/or against stray radiation.

A method according to embodiments of the present invention may furthermore comprise the step of metallizing at least one portion of the front surface to form at least one contact pad, and depositing at least one solder bump on the at least one contact pad.

A method according to embodiments of the present invention may furthermore comprise re-melting the at least one solder bump while the front surface is positioned on a carrier such that the at least one solder bump is aligned with an at least one corresponding connector on the carrier.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
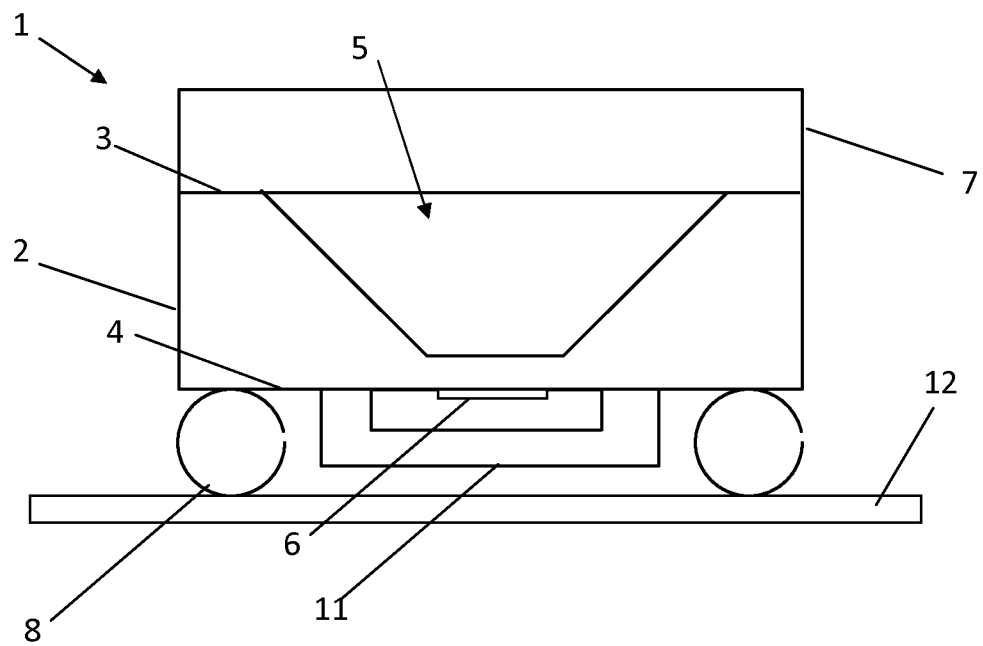
FIG. 1 shows a first device according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, the present invention relates to an integrated infrared sensor device. This device comprises a first substrate, further referred to as the sensor substrate. This sensor substrate has a first surface, further referred to as the back surface, and a second surface, further referred to as the front surface, the front surface being on a side of the substrate opposite to the side of the back surface. Furthermore, the front surface may refer to the side of the substrate on which integrated circuitry is provided in standard integrated circuit manufacturing process steps, while the back surface may refer to the side of the substrate which corresponds to the bulk material, e.g. the side which typically will not have circuitry features processed thereon or which has fewer and/or larger scale processed features thereon when compared to the front surface.

In a device according to the first aspect of the invention, a cavity is defined in the back surface, while the front surface has at least one infrared sensing element formed therein or arranged thereon, e.g. at least one infrared sensing element is arranged in or on the front surface. Over the at least one sensing element, at the front surface, a cap is provided for protecting the at least one sensing element, e.g. against mechanical damage and dust, and/or against stray radiation.

Furthermore, the device comprises a second substrate arranged on the first surface (back surface) of the first substrate, such that the second substrate, further referred to as the filter substrate, at least partially covers the cavity, for example such that the filter substrate substantially covers the cavity, e.g. such that the filter substrate entirely covers the cavity. The filter substrate is furthermore adapted, e.g. adapted in shape and/or composition, to transmit infrared radiation while attenuating radiation outside the infrared spectrum, e.g. attenuating radiation in at least a portion of the visible light spectrum.

Referring to FIG. 1, an integrated infrared sensor device 1 according to embodiments of the present invention is shown. This integrated infrared sensor device 1 may be an infrared sensor module, e.g. a semiconductor module comprising an infrared sensing element, e.g. a complementary metal-oxide semiconductor (CMOS) infrared sensor module embedded in a chip-scale package. For example, the integrated infrared sensor device 1 may be adapted in shape and physical dimensions such that the package footprint area is equal to or less than 1.2 times the area of the semiconductor die in or on which the infrared sensing element is implemented, e.g. such integrated circuit chip carrier may be a wafer-level chip-scale package or a wafer-level package.

It is an advantage of an integrated infrared sensor device 1 according to embodiments of the present invention that the sensor device can be easily manufactured, e.g. using wafer level processing. Furthermore, it is an advantage that such integrated infrared sensor device 1 can have a small volume, and particularly, a low height profile.

The integrated infrared sensor device 1 comprises a sensor substrate 2, e.g. a first wafer. This sensor substrate 2 may comprise a semiconductor material, such as silicon or germanium. The sensor substrate 2 may be a semiconductor substrate suitable for being processed by complementary metal-oxide semiconductor (CMOS) manufacturing steps, e.g. the sensor substrate may be a p-type semiconductor substrate suitable for CMOS processing.

The sensor substrate 2 comprises a back surface 3 and a front surface 4 opposite the back surface 3, e.g. the sensor substrate 2 may be a planar semiconductor substrate having two sides, corresponding to the back surface 3 and the front surface 4. In the back surface 3, a cavity 5 is defined. For example, a cavity may be provided in the back surface 3 by etching away a portion of the sensor substrate. For example, an anisotropic etching, e.g. an orientation dependent wet etching, may be applied to the back surface 3 to define the cavity 5 therein. In embodiments of the present invention, the cavity 5 may be provided by applying a potassium hydroxide (KOH) wet etching to the back surface. It is particularly advantageous to provide such cavity by applying a back surface etch, as this allows etching the cavity without damaging circuitry, interconnections and/or components already manufactured in or on the front surface.

At least one infrared sensing element 6 is arranged on the front surface 4 or formed in the front surface 4. For example, the at least one infrared sensing element 6 may comprise a first and a second temperature-sensitive element in a dielectric stack, for example such that at least one thermocouple is formed, e.g. such that a thermopile is formed. The cavity

5 may furthermore be adapted for thermally insulating the first temperature-sensitive element from the second temperature-sensitive element.

For example, the integrated infrared sensor device may comprise a volume of infrared absorbing material, e.g. arranged in or on the front surface 4, and exposed to incident infrared radiation, e.g. radiation transmitted through the filter substrate 7 and the cavity 5. A temperature difference between this absorber and the surrounding material, e.g. the bulk semiconductor material of the sensor substrate 2, can then be registered to quantify the amount of incident radiation, e.g. a voltage, current, resistance or other electrical quantity which is influenced by the temperature difference can be recorded. The temperature difference may for example be detected by one or more thermocouples having hot junctions in or near the absorber and cold junctions in or near the surrounding material.

Thermal isolation between the absorber and the surrounding material may be provided by the cavity 5. The semiconductor material between the cavity 5 and the absorbing material is thus thinned out such that thermal contact of the absorber with the sensor wafer material is reduced.

For example, an integrated circuit may be provided in and/or on the front surface 4. Such integrated circuit may thus implement one or more infrared sensing element 6, but may also comprise additional integrated circuit elements for, for example, applying amplification, analog-to-digital conversion, serialization, filtering or other processing to the output produced by the at least one infrared sensing element 6. The integrated circuit may also comprise a thermistor element for registering a reference temperature of a bulk portion of the first substrate, e.g. a portion which implements a heat sink thermally connected to at least one cold junction of the at least one infrared sensing element 6. Such integrated circuit may comprise processing means, e.g. an ASIC, implemented on the same semiconductor die as the infrared sensing element 6, such that no wiring is required for operably connecting the infrared sensing element to the ASIC.

The infrared sensor device also comprises a cap 11, arranged on the front surface 4, e.g. covering the one or more infrared sensing elements 6. The cap 11 may be made of semiconductor material, for instance silicon or germanium. Cap dimensions should be suitable for covering the one or more infrared sensing elements 6. Cap size may for instance between 2 mm×2 mm and 3 mm×3 mm, and between 0.3 mm to 1.0 mm thick. The cap cavity can be made by any suitable method from a piece of semiconductor material, for instance by means of cheap wet etch techniques. It is an advantage of a cap 11 according to embodiments of the present invention that it can cheaply—in view of its small size—incorporate an optical filter to do wavelength selective detection for, for instance, gas detection. External optical filters have to be much bigger in view of the optics present, and are thus much more expensive.

The cap 11 may protect the sensor, for instance a sensor membrane, against mechanical damage and dust. The cap 11 furthermore may protect the sensor from the effect of visible light which would make temperature measurements impossible.

In embodiments of the present invention, the cap can integrate diffractive or refractive lens optics.

A cavity may be made in the cap 11, such that space is present between the sensor 6 and the cap 11. That cavity can be made vacuum, which improves the sensitivity of the sensor 6.

Furthermore, the device 1 comprises a second substrate 7, the filter substrate, arranged on the first surface 3 of the sensor substrate 2, such that the filter substrate 7 at least partially covers the cavity 5, for example such that the filter substrate 7 substantially covers the cavity 5, e.g. such that the filter substrate 7 entirely covers the cavity 5. The filter substrate 7 is furthermore adapted in shape and composition to transmit infrared radiation incident thereon. The filter substrate 7 may advantageously be adapted for reflecting or strongly attenuating radiation outside the infrared spectrum, for example at least part of the visible spectrum.

In a device according to embodiments of the present invention, the filter substrate 7 may be bonded to the back surface 3 of the sensor substrate 2, for example using an adhesive, such that a closure of the cavity 5 is obtained that sufficiently shuts out stray light outside the infrared spectrum, e.g. visible light which might interfere with the operation of the infrared sensing element 6. For example, the filter substrate 7 may be bonded to the back surface 3 of the sensor substrate 2 by glass frit bonding.

In embodiments of the present invention, the integrated infrared sensor device 1 may also comprise at least one solder bump 8 arranged on the front surface 4 of the sensor substrate 2 for connecting the integrated infrared sensor device to a carrier 12 in a flip-chip arrangement. Such at least one solder bump 8 may advantageously thermally connect the integrated infrared sensor device 1 to the carrier 12, e.g. may provide an efficient thermally conductive path between the carrier 12 and the bulk material of the sensor substrate 2, e.g. such that one leg of a thermopile can be maintained at substantially the local background temperature. Furthermore, the at least one solder bump 8 may alternatively or additionally provide an electrically conductive path, for example for enabling an output electrical signal indicative of the amount of incident infrared radiation to be transmitted from the infrared sensor device to the carrier 12, e.g. to a printed circuit board having supporting electronics provided thereon for further manipulating such electrical signal.

Here, the flip chip arrangement refers to a controlled collapse chip connection mechanism as known in the art, where an integrated circuit semiconductor device, such as the integrated infrared sensor device 1 according to embodiments, is connected to external circuitry with solder bumps 8 that may have been deposited onto chip pads. These solder bumps 8 may be deposited on the chip pads on the top side of the wafer during the final wafer processing step. In order to mount the chip to external circuitry, e.g. to a circuit board or another chip or wafer, it is flipped over so that its top side faces down, and aligned so that its pads align with matching pads on the external circuit. Then, the interconnection can be completed by melting the solder. Furthermore, such close contact interconnect achieved by a flip chip arrangement may have the advantage of blocking out stray light, e g infrared and/or visible light, from the front surface 4, which might otherwise interfere with the operation of the at least one infrared sensing element 6.

The device 1 according to embodiments of the present invention may also comprise alternative means for providing a flip-chip arrangement, e.g. instead of or in addition to the at least one solder bump 8, gold balls or moulded studs or protrusions composed of an electrically conductive polymer may be used. For example, a plated bump process may be used.

Figure 2:
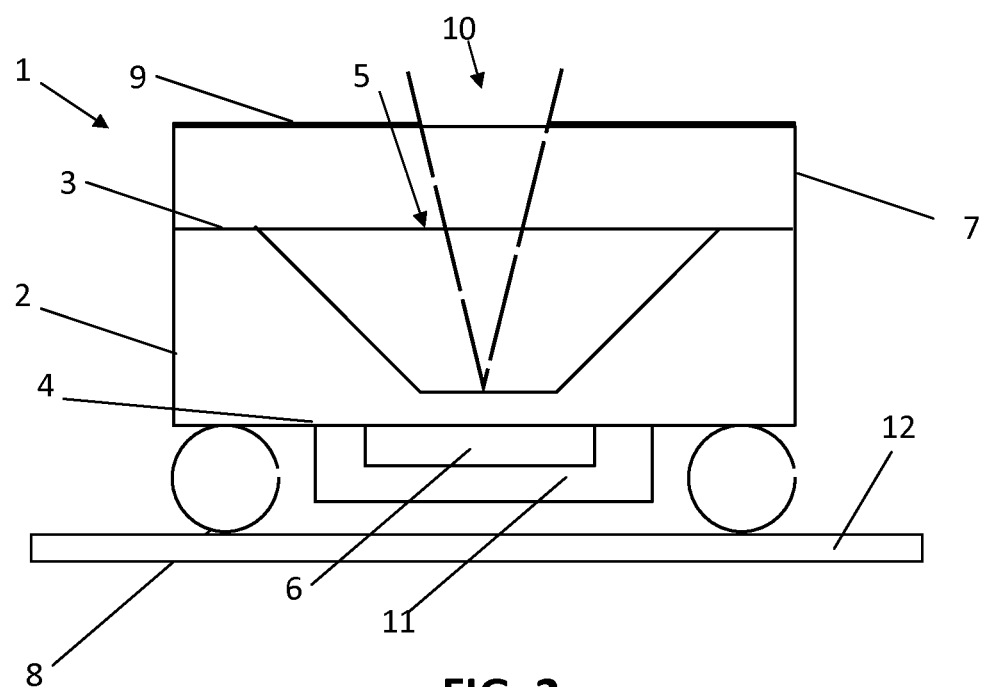
FIG. 2 shows a second device according to embodiments of the present invention.

Referring to FIG. 2, a second device according to embodiments of the invention is shown. Same or similar elements as in FIG. 1 are not described in detail again, but are indicated with same reference numbers. Here, the integrated infrared sensor device 1 furthermore comprises a coating 9 applied to the filter substrate 7 for collimating the field of view 10 of the at least one infrared sensing element 6. For example, a peripheral region with respect to the at least one infrared sensing element 6 underneath may be provided with a coating 9 to substantially block incident radiation, e.g. to reflect or attenuate infrared radiation incident thereon, while a more central region with respect to the infrared sensing element 6 underneath is not provided with such coating, e.g. such that infrared radiation incident on this central region may propagate through the filter substrate 7 in a substantially unattenuated manner.

In a second aspect, the present invention relates to a method for manufacturing an integrated infrared sensor device, e.g. an integrated infrared sensor device according to embodiments of the first aspect of the present invention.

Figure 3:
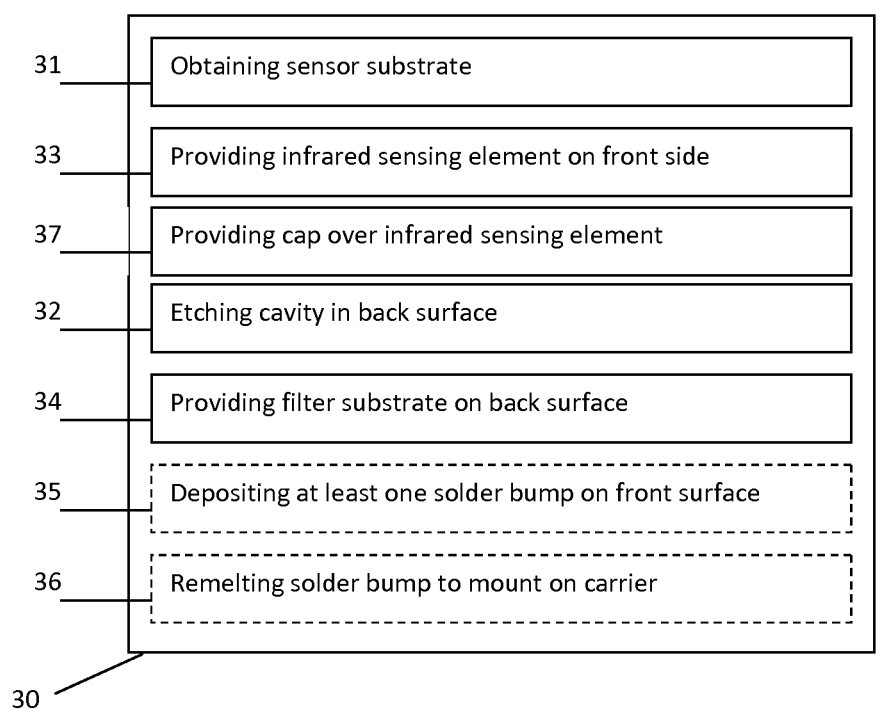
FIG. 3 illustrates a flow chart of a method according to embodiments of the present invention for manufacturing an integrated infrared sensor device.

Referring to FIG. 3 an exemplary method 30 for manufacturing an integrated infrared sensor device according to this second aspect of the invention is shown. This method 30 comprises the step of obtaining 31 a sensor substrate 2 having a back surface 3 and a front surface 4 opposite the back surface 3. The sensor substrate 2 may for example be a semiconductor substrate suitable for CMOS processing, e.g. a p-type or n-type silicon substrate.

The method 30 further comprises providing 33 at least one infrared sensing element 6 on the front surface 4 of the sensor substrate 2. For example, integrated circuits may be created on the sensor substrate wafer using process steps as known in the art. The integrated circuits may implement the at least one infrared sensing element 6, but also other components, e.g. an ASIC for converting the signal provided by the infrared sensing element 6 to an output signal of the sensor device. Process steps for creating such integrated circuits may for example comprise standard CMOS processing techniques.

After having provided 33 the at least one infrared sensing element 6, a method according to embodiments of the present invention provides a step of providing 37 a cap 11 over the at least one sensing element 6. The cap 11 is provided for protecting the at least one sensing element, e.g. against mechanical damage and dust, and/or against stray radiation.

The method 30 also comprises etching 32 a cavity 5 in the back surface 3 of the sensor substrate 2, for example, etching away the substrate material around a position on the back surface 3 corresponding, e.g. orthogonally opposite, to a position of the at least one infrared sensing element 6 on the front surface 4. The method 30 may thus comprise etching 32 a cavity 5 in the back surface 3 to restrict thermal conduction from the at least one infrared sensing element 6 to the bulk material of the sensor substrate.

The method 30 further comprises providing 34 a filter substrate 7 on the back surface 3 of the sensor substrate 2 for at least partially covering the cavity 5, e.g. for completely covering the cavity 5. This filter substrate 7 is adapted in shape and composition to transmit infrared radiation and to attenuate radiation in at least part of the visible light spectrum, as explained in detail in relation to the first aspect of the invention.

The method 30 may furthermore comprise the step of metallizing 35 at least one portion of the front surface 4 to form at least one contact pad, and depositing at least one solder bump 8 on the at least one contact pad. For example, the method 30 may comprise metallizing portions of the front surface 4 to form contact pads, and depositing a solder dot 8 on each of these contact pads.

Furthermore, the method 30 may comprise re-melting the at least one solder bump 8 while the front surface 4 is positioned on a carrier 12 such that the at least one solder bump 8 is aligned with an at least one corresponding connector on the carrier 12. Thus, the method 30 may optionally also comprise re-melting the solder dots 8, e.g. using hot air reflow, while the front surface is positioned on a carrier 12 such that the solder dots 8 are facing corresponding connectors on the carrier 12, e.g. for connecting to external circuitry. For example, to attach the device in flip-chip arrangement onto a circuit, the solder dots may be brought down onto connectors on the underlying electronics or circuit board. The solder may then be re-melted to produce an electrical connection, e.g. using an ultrasonic or alternatively reflow solder process. Thus, only a small space can separate the device's circuitry from the underlying mounting. An electrically-insulating adhesive may furthermore be underfilled to provide a stronger mechanical connection, to provide a heat bridge, and to ensure the solder joints are not stressed due to differential heating of the chip and the rest of the system. It is an advantage of such an assembly that it may be smaller than a traditional carrier-based system and that the chip sits directly on the circuit board, e.g. such that light interfering with infrared radiation detection is blocked out from the carrier side. Also, the short connection path length may reduce inductance, thus allowing high speed signals, and good heat conduction.

The invention claimed is:

1. An integrated infrared sensor device, comprising:
   a sensor substrate having a back surface and a front surface opposite the back surface, said back surface having a cavity defined therein, said front surface having at least one infrared sensing element formed therein or arranged thereon, and
   a filter substrate arranged on said back surface of the sensor substrate such that said filter substrate at least partially covers the cavity, the filter substrate furthermore being adapted in shape and composition to transmit infrared radiation and to attenuate radiation in at least part of the visible light spectrum, and
   a cap for protecting the at least one sensing element, said cap being arranged on the front surface,
   the integrated infrared sensor device further comprising at least one solder bump arranged on the front surface of the sensor substrate for connecting the integrated infrared sensor device to a carrier in a flip-chip arrangement.

2. The integrated infrared sensor device according to claim 1, in which said filter substrate is bonded to the back surface of the sensor substrate.

3. The integrated infrared sensor device according to claim 2, in which said filter substrate is bonded to said back surface by glass frit bonding.

4. The integrated infrared sensor device according to claim 1, said integrated infrared sensor device comprising a volume of infrared absorbing material exposed to incident infrared radiation, in which said at least one infrared sensing element comprises a first and a second temperature-sensitive element in a dielectric stack for registering a temperature difference between said absorber and a bulk semiconductor material of the sensor substrate, said cavity being adapted for providing thermal isolation between the absorber and the bulk semiconductor material.

5. The integrated infrared sensor device according to claim 1, furthermore comprising a coating applied to said filter substrate for collimating a field of view of said at least one infrared sensing element.

6. A method for manufacturing an integrated infrared sensor device, the method comprising:
   obtaining a sensor substrate having a back surface and a front surface opposite the back surface, providing at least one infrared sensing element on said front surface,
   providing a cap over the at least one sensing element for protecting the at least one sensing element,
   etching a cavity in said back surface, and
   providing a filter substrate on said back surface for at least partially covering the cavity, in which said filter substrate is adapted in shape and composition to transmit infrared radiation and to attenuate radiation in at least part of the visible light spectrum, the method further comprising a step of metallizing at least one portion of the front surface to form at least one contact pad, and depositing at least one solder bump on the at least one contact pad.

7. The method according to claim 6, further comprising remelting the at least one solder bump while the front surface is positioned on a carrier such that the at least one solder bump is aligned with an at least one corresponding connector on the carrier.

\* \* \* \* \*